United States Patent [19]
Shugrue

[11] Patent Number: 6,095,158
[45] Date of Patent: Aug. 1, 2000

[54] ANHYDROUS HF IN-SITU CLEANING PROCESS OF SEMICONDUCTOR PROCESSING CHAMBERS

[75] Inventor: John K. Shugrue, Fremont, Calif.

[73] Assignee: Lam Research Corporation, Fremont, Calif.

[21] Appl. No.: 08/796,223

[22] Filed: Feb. 6, 1997

[51] Int. Cl.$^7$ ............................... B08B 3/12; C03C 23/00
[52] U.S. Cl. ..................................... 134/1; 134/2; 216/73
[58] Field of Search ............................... 134/1, 2; 216/73

[56] References Cited

U.S. PATENT DOCUMENTS

| 5,100,495 | 3/1992 | Ohmi et al. | 156/345 |
|---|---|---|---|
| 5,584,963 | 12/1996 | Takahashi | 156/646.1 |

FOREIGN PATENT DOCUMENTS

| 03183125 | 8/1991 | Japan . |
|---|---|---|
| 4-333570 | 11/1992 | Japan . |
| 5-214339 | 8/1993 | Japan . |
| 6-128082 | 5/1994 | Japan . |
| 6-173012 | 6/1994 | Japan . |

*Primary Examiner*—William Powell
*Assistant Examiner*—George Goudreau
*Attorney, Agent, or Firm*—Beaver Weaver Thomas & Nguyen, LLP

[57] ABSTRACT

A method for removing glass deposition from a reactor chamber, at least one interior surface of the reactor chamber having the glass deposition deposited thereon. The invention includes introducing a gaseous cleaning mixture comprising an anhydrous hydrogen fluoride (HF) gas into the chamber interior. The invention further includes maintaining the chamber interior at a temperature of between about 0° C. and about 300° C., and removing a gaseous reaction byproduct from the chamber interior.

9 Claims, 5 Drawing Sheets

| Parameters | General Range | Preferred Range | More Preferred Range |
|---|---|---|---|
| Temperature (°C) | 0-300 | 17-50 | 25 |
| HF Flow rate (Std. liters/minute) | limited by minimum throughput - as high as pump capacity | 15-35 | 25 |
| Pressure (Torr) | 10-650 | 50-500 | 400 |

FIG. 5

ANHYDROUS HF IN-SITU CLEANING PROCESS OF SEMICONDUCTOR PROCESSING CHAMBERS

BACKGROUND OF THE INVENTION

This invention relates to the cleaning of a semiconductor processing chamber. More particularly, the present invention relates to in-situ cleaning of a semiconductor deposition chamber using anhydrous hydrogen fluoride (HF).

Semiconductor processing chambers such as deposition reactors are widely used in the semiconductor industry to deposit films of material onto substrates. Deposition reactors may include reactors such as plasma-enhanced chemical-vapor deposition (PECVD), physical vapor deposition (PVD), or chemical vapor deposition (CVD) reactors, all of which are well known to those skilled in the art.

When a deposition reactor is employed for depositing material on a substrate, e.g., on a semiconductor wafer or a glass panel for fabrication of flat panel displays, the deposition material may undesirably collect on the inside surfaces of the deposition chamber, e.g., chamber sidewalls or substrate holder, etc. Periodically, this unwanted deposition material must be removed from the chamber inner surfaces before the accumulated build-up interferes with deposition process performance, e.g., by contaminating the substrate in subsequent depositions. Glass materials, such as silicon dioxide ($SiO_2$) and borophosphosilicate glass (BPSG), are common examples of deposition materials that may be undesirably accumulated inside the deposition chamber and may interfere with subsequent depositions.

Undesirable accumulation of glass material, e.g., silicon dioxide ($SiO_2$), may take place, for example, during fabrication of a metal oxide semiconductor (MOS) transistor. As is well known to those skilled, silicon dioxide ($SiO_2$) is typically employed as the dielectric insulating material, and multiple layers of silicon dioxide ($SiO_2$) may be deposited on a substrate before the fabrication of the desired circuit is completed. Glass deposition may also take place, as is well known, during the fabrication of devices other than MOS transistors.

With reference to silicon dioxide (SiO2), for example, this material may be deposited using any of the conventional deposition chambers. For consistency of illustration, the remaining disclosure is discussed in connection with a thermal chemical vapor deposition system, particularly one known as the DSM9800™ CVD system, which is available from Lam Research Corporation of Fremont, Calif. It should be borne in mind, however, that the inventive in-situ cleaning process may apply to any semiconductor processing chamber, whether or not involving plasma, in which removal of unwanted deposition material, e.g., glass deposition, is desired.

Figure 1:
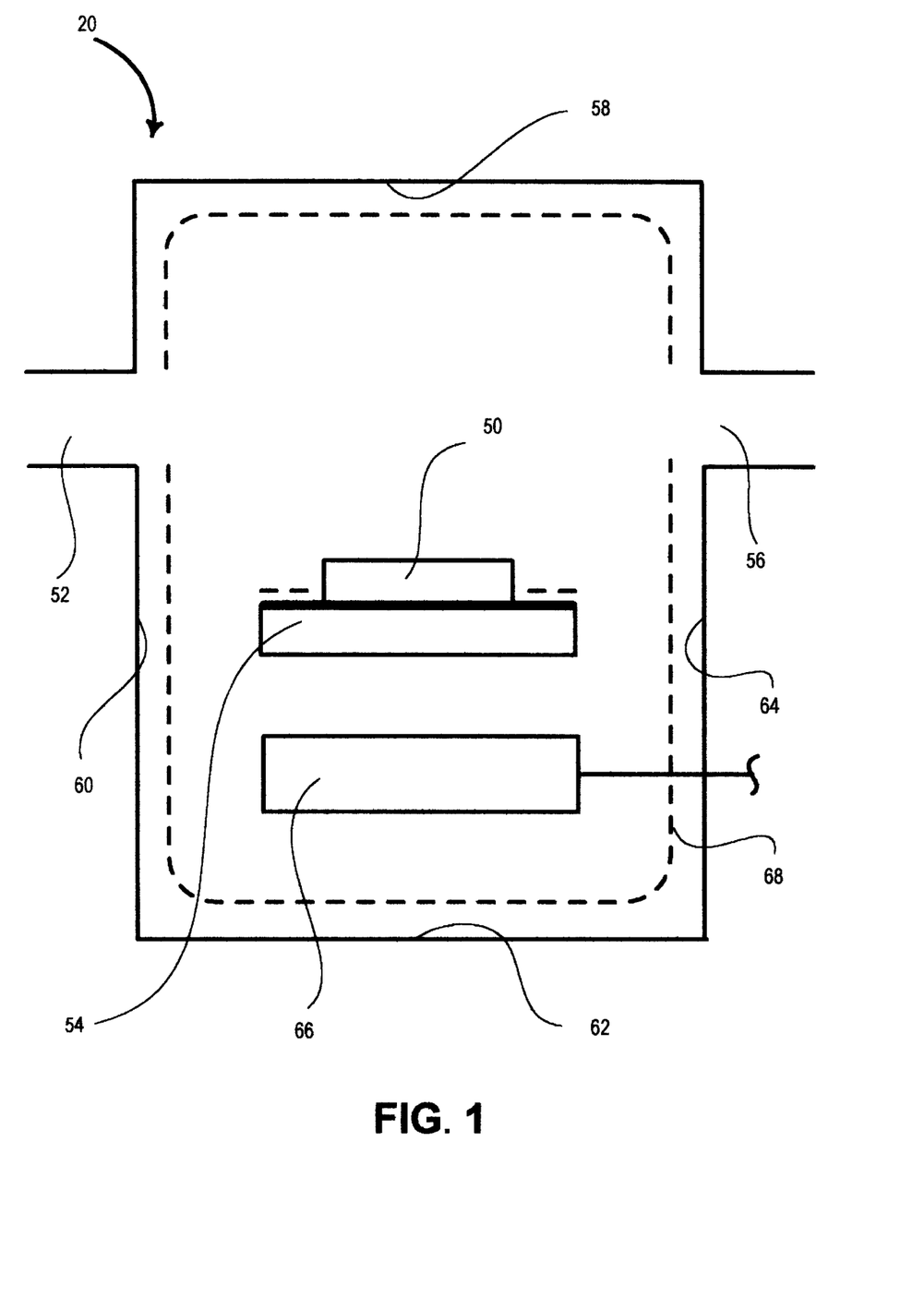
FIG. 1, for illustration purposes, shows a thermal chemical vapor deposition (CVD) reactor where (silicon dioxide) $SiO_2$ deposition may be carried out.

FIG. 1 illustrates a simplified schematic of a deposition chamber representing, for example, a reactor chamber of the aforementioned DSM9800® CVD system. As shown in FIG. 1, a deposition chamber 20 may include a gas inlet 52 for introducing a deposition source gas, e.g., silane, triethylorthosilicate (TEOS), diborosilane and others familiar to those skilled in the art, into the interior of deposition chamber 20. The deposition source gas, when exposed to a deposition temperature ranging from between about 700° C. to about 900° C., may at least partially decompose to facilitate the deposition of some decomposed gas component (s) on a substrate 50, e.g., a silicon wafer, which may be secured on a work piece holder or chuck 54. The remaining unused deposition gas and byproduct gases, which may include volatile and residual gases, may be exhausted through an outlet port 56. An energy source 66 representing for example a series of lamps provide regular infrared heating, a graphite heater, or any other suitable energy source may be employed to maintain a suitable temperature within the deposition chamber to facilitate deposition.

In a number of cases, the insides of the deposition chamber 20, e.g., reactor side-walls 58, 60, 62, 64 and chuck 54, may also be at the appropriate temperature to induce deposition. Accordingly, these surfaces may be undesirably coated with the deposited materials which, as discussed hereinabove, may build up over time and potentially interfere with deposition process performance.

The above discussion applies primarily to thermal CVD reactors, i.e., reactors in which deposition occurs via a heat activated reaction. In plasma-enhanced deposition chambers, e.g., those employing an ECR (electron cyclotron resonance) power source, parallel plates, or TCP™ coils (whether or not planar) to inductively or capacitively couple the plasma, a plasma may be struck within the deposition chamber with the deposition source gas to facilitate deposition on a substrate. The mechanisms associated with plasma-enhanced deposition, as well as physical vapor deposition, are well known to those skilled in the art and are not repeated here in order not to unnecessarily obscure the invention.

Although plasma-enhanced deposition may, in some cases, more effectively control the directionality of the deposition material, it is found that some of the surfaces within the plasma deposition chamber may also be coated with the deposition material after a number of deposition operations. This is particularly true for surfaces directly exposed to the plasma.

The unwanted $SiO_2$ deposition may be removed either by an in-situ process or by taking the reactor apart and manually clean the components. In-situ cleaning is generally desirable since it does not require disassembly of the reactor chamber and does not involve the concomitant down time associated therewith. In the prior art, in-situ cleaning may be achieved by sputtering the accumulated layers with plasma created from an inert gas, such as argon or nitrogen. The sputtering operation typically involves introducing inert gas into the deposition chamber and striking a plasma with the introduced inert gas to accelerate the ions toward the desired target surfaces, e.g., surfaces where there are unwanted $SiO_2$ depositions. The sputtered material is then removed from the deposition chamber by evacuating it via an outlet port.

The above described sputtering technique, however, suffers from a major drawback. The $SiO_2$ deposition film on the interior surfaces may not be uniform throughout, i.e., there may exist uneven depositions of $SiO_2$ on the chamber's side-walls. During sputtering of $SiO_2$, some of the soft side-wall material (comprising aluminum in some systems) in areas no longer covered by accumulated $SiO_2$ may also be sputtered off. As a result, the deposition chamber side-wall may be thinned slightly with each cleaning cycle and may eventually fail over time.

Another method that is typically employed to clean accumulated $SiO_2$ involves using a plasma formed from nitrogen trifluoride ($NF_3$). In the presence of plasma, $NF_3$ decomposes to produce free fluorine ions, which react with the silicon (Si) species in $SiO_2$ to produce silicon tetrafluoride ($SiF_4$) gas and oxygen ($O_2$) gas. The reaction byproducts are then pumped out of the deposition chamber as waste.

Although the $NF_3$ plasma cleaning technique is less physically damaging to interior walls of the deposition chamber (relative to the sputtering cleaning technique), this method has several drawbacks. $NF_3$ source gas is expensive to purchase, toxic to handle, and relatively inefficient in cleaning, e.g., typically achieving an $SiO_2$ etch rate of only about 4,000 angstroms/min to about 8,000 angstroms/min. $NF_3$ residues, some of which may be exhausted out of the chamber, is also dangerous and expensive to dispose of. Further, the $NF_3$ plasma cleaning technique produces flourine ions, which sputters the aluminum to form silicon tetrafluoride ($SiF_4$) nodules as a byproduct. As can be appreciated by those skilled, the undesirable formation of aluminum tetrafluoride ($AlF_4$) nodules via flourine ion sputtering may lead to further contamination of subsequent depositions.

Further, both of the above approaches require plasma to perform their cleaning functions. Accordingly, they are not well suited to cleaning reactors which do not employ or have the ability to generate plasma, e.g., thermally activated deposition chambers. In view of the foregoing, what is needed is an improved method of in-situ cleaning reactor chambers.

SUMMARY OF THE INVENTION

The invention relates, in one embodiment, to a method for removing glass deposition from a reactor chamber, at least one interior surface of the reactor chamber having the glass deposition deposited thereon. The invention includes introducing a gaseous cleaning mixture comprising an anhydrous hydrogen fluoride (HF) gas into the chamber interior. The invention further includes maintaining the chamber interior at a temperature of between about 0° C. and about 300° C., and removing a gaseous reaction byproduct from the chamber interior.

In another embodiment, the invention relates to a method for removing $SiO_2$ deposition from a deposition reactor chamber interior. The deposition reactor chamber interior is configured for depositing $SiO_2$ material on a substrate. The method includes introducing a gaseous cleaning mixture comprising anhydrous hydrogen fluoride (HF) gas into the deposition reactor chamber interior, and maintaining the deposition reactor chamber interior at a temperature of between about 0° C. and about 300° C. The method further includes maintaining the deposition reactor chamber interior at a pressure of below about 760 Torr at sea level. There is further included removing a reaction byproduct from the deposition reactor chamber interior.

These and other advantages of the present invention will become apparent upon reading the following detailed descriptions and studying the various figures of the drawings.

DETAILED DESCRIPTION OF THE PREFERRED EMBODIMENTS

An invention is described for in-situ cleaning of a deposition chamber using anhydrous hydrogen fluoride (HF). In the following description, numerous specific details are set forth in order to provide a thorough understanding of the present invention. It will be obvious, however, to one skilled in the art, that the present invention may be practiced without some or all of these specific details. In other instances, well known process steps have not been described in detail in order not to unnecessarily obscure the present invention.

In accordance with one aspect of the present invention, anhydrous HF in its gaseous state is introduced at a suitable temperature, e.g., between about 0° C. and 300° C., into the reactor chamber to be cleaned. The use of anhydrous HF advantageously simplifies delivery of the reactant source gas since, as is well known, it is substantially simpler to deliver a gas into all areas of the chamber interior than to deliver a liquid. The anhydrous HF gas reacts with the accumulated $SiO_2$ to produce $SiF_4$ gas and water. The reaction proceeds in accordance to the following equation:

$$4HF(gas) + SiO_2(solid) \rightarrow 2H_2O(gas) + SiF_4(gas) \qquad \text{(Eq. 1)}$$

While not wishing to be bound by theory, it is believed that the thin film of water produced in accordance with Eq. 1 remain on the surfaces of the chamber interior and help to convert the anhydrous HF gas into an aqueous HF solution. It is believed that this aqueous HF solution, when allowed to temporarily remain on the surfaces of the chamber interior, help improve the etch rate since the aqueous HF solution may be able to etch the accumulated $SiO_2$ more effectively than anhydrous HF gas. This is a nonobvious and surprising feature of the invention since it was expected that the etch rate associated with anhydrous HF gas would be relatively low. As it turns out, the $SiO_2$ etch rate is higher than expected, e.g., about 4 microns/minute in one example, which is about the etch rate expected of liquid (aqueous) HF. Accordingly, the invention facilitates ease of delivery of the reactant material (by permitting the use of a reactant gas and not liquid) while yielding the high etch rates typically expected of liquid reactants.

Referring back to Eq. 1, as water is evaporated in the chamber interior and is pumped out of the chamber interior along with the gaseous $SiF_4$ byproduct gas, more water is produced in accordance with Eq. 1 to replace the evaporated water molecules, thereby sustaining the reaction until all $SiO_2$ is etched away and water is no longer produced. Since water is no longer produced to replenish the evaporated water molecules after all $SiO_2$ is exhausted, the remaining water film will evaporate completely and be pumped away sometime afterward, thereby elegantly completing the cleaning process.

Figure 2:
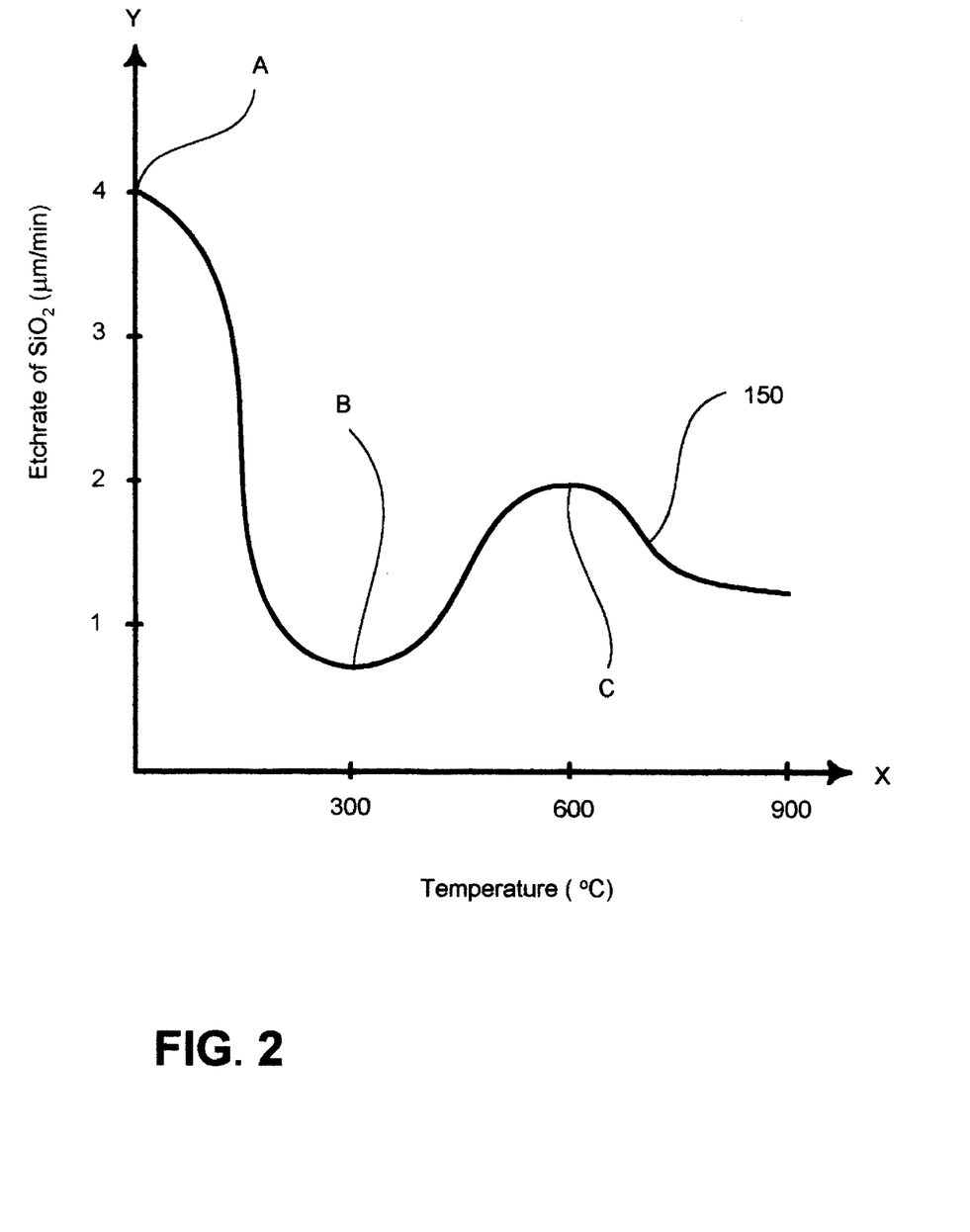
FIG. 2 is a graph illustrating, in accordance with one embodiment of the invention, the $SiO_2$ etch rate versus the temperature inside the deposition chamber during $SiO_2$ removal.

As mentioned earlier, cleaning is performed, in accordance with one aspect of the invention, at a chamber temperature between about 0° C. and 300° C. This temperature regime tends to maximize etch rate of $SiO_2$ to reduce the cleaning time, thereby improving the overall throughput of the system, i.e., improving the average number of substrates processed per unit of time. To further discuss this aspect of the invention, FIG. 2 is a graph of $SiO_2$ etch rate versus chamber temperature obtained for a given $SiO_2$ etch experiment. In FIG. 2, a curve 150 shows the various etch rates obtained via the anhydrous HF in-situ etch when the temperature ranges from about 0° C. to about 900° C. Curve 150 may begin at a first maximum peak A where the temperature is about 0° C. At point A, the SiO2 etch rate may be about 4 μm/min. As the temperature is raised from about 0° C. to about 300° C., the $SiO_2$ etch rate decreases and reaches a minimum at point B. At minimum point B, the temperature is shown to be about 300° C., and the $SiO_2$ etch rate may be about 0.75 μm/min.

When the temperature is increased from about 300° C. to about 600° C., the $SiO_2$ etch rate increases and reaches a second maximum peak at point C. At second maximum peak C, the temperature may be about 600° C. and the $SiO_2$ etch rate may be about 2.0 μm/min, which is lower than the $SiO_2$ etch rate at the first maximum peak A. As shown in FIG. 2, anhydrous HF is capable of etching $SiO_2$ at a relatively high etch rate when the chamber is at room temperature, e.g., about 25° C.

Figure 3:
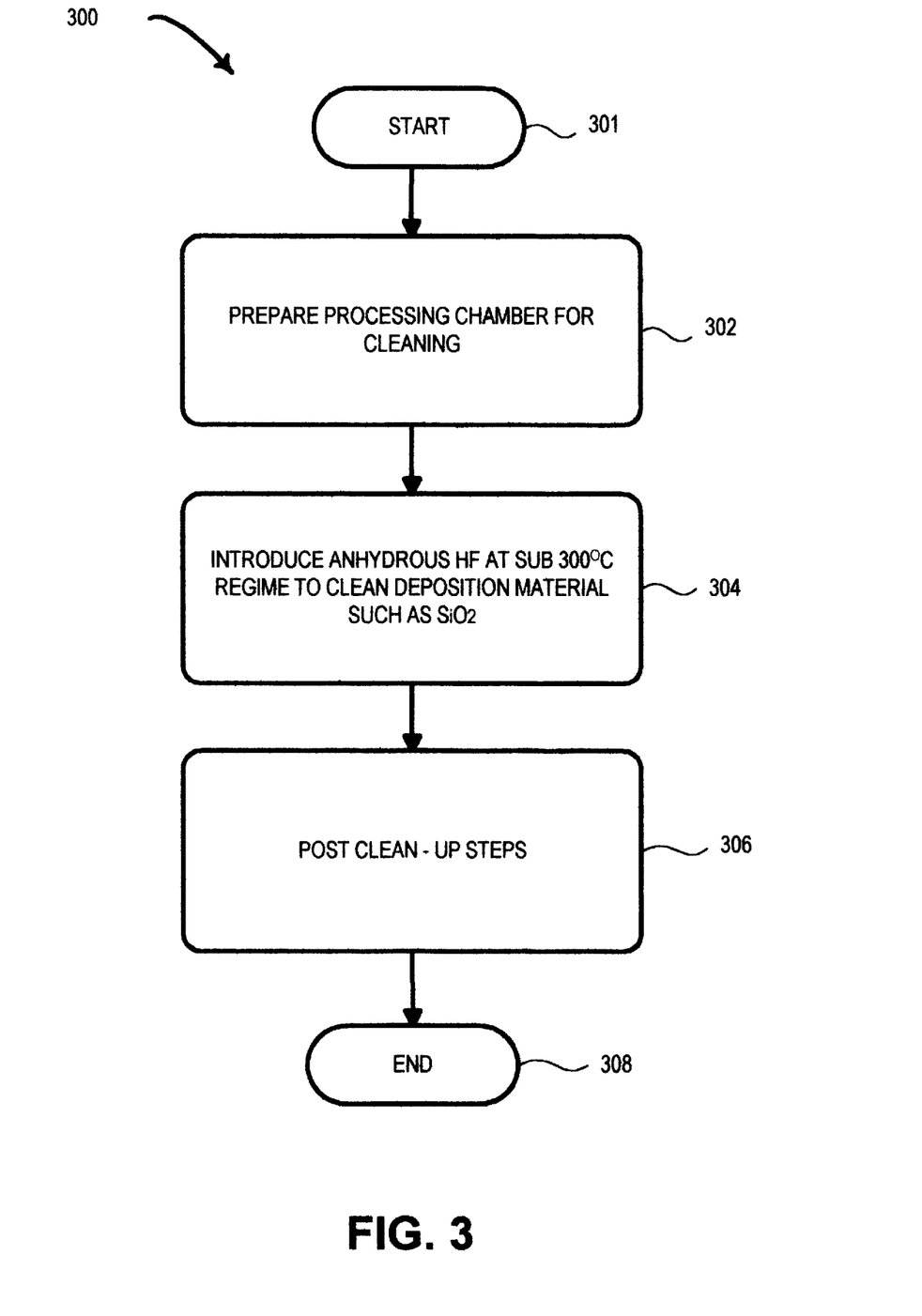
FIG. 3 shows, in accordance with one embodiment of the present invention, a process flow diagram of the steps for cleaning a deposition chamber.

To further illustrate the features and advantages of the present invention, FIG. 3 shows, according to one embodiment of the present invention, a process 300 suitable for cleaning a reactor chamber, e.g., the one shown in FIG. 1, with anhydrous hydrogen fluoride (HF) as the reactant source gas. Although $SiO_2$ is discussed herein to facilitate consistency and ease of illustration, it should be borne in mind that the present invention applies equally well to the removal of deposition materials such as Si, PSG, BSG, BPSG, and fluorine-doped $SiO_2$, W, Ti, Ta, $Ta_2O_5$. It is contemplated that anhydrous HF reacts with these deposition materials, forming gaseous products that may be pumped out of the reactor chamber relatively easily. Accordingly, the discussion with reference to $SiO_2$ is intended to be illustrative only and is not intended to be limiting in anyway.

In step 302, the reactor chamber may be prepared for cleaning. Step 302 may include removing from the chamber interior the substrates and/or any other structures to which HF exposure is undesirable, cooling down the reactor chamber to the appropriate temperature for cleaning, and/or connecting the gas inlet port (e.g., gas inlet port 52 as shown in FIG. 1) to a supply of anhydrous HF gas.

In a step 304, anhydrous HF gas is introduced into the reactor chamber (e.g., through gas inlet port 52 of FIG. 1) preferably at a chamber temperature below about 300° C. to clean out the accumulated glass deposition. It is speculated that anhydrous HF, when introduced at the low temperature of the present invention and in the absence of plasma, has insufficient energy to provide a satisfactory $SiO_2$ etch rate. Nevertheless, the nonobvious mechanism of forming aqueous HF solution, as discussed earlier in connection with Eq. 1, allows etching of the accumulated $SiO_2$ to proceed at a surprisingly high rate.

The above theory regarding the nonobvious mechanism of aqueous HF solution formation is substantiated by evidence of water evaporation, which is found on a test wafer employed to test the theory. In this experiment, a wafer comprising a layer of $SiO_2$ overlying a layer of aluminum is subject to anhydrous HF gas cleaning in the aforementioned DSM9800™ CVD deposition reactor. The experiment is discussed in further detail in connection with FIG. 5 herein. After the $SiO_2$ layer is etched away, water stain marks are found on the surface of the wafer, suggesting that liquid water exists during etching.

It is believed that the above theory is also circumstantially substantiated by the surprisingly high $SiO_2$ etch rate for an etch employing anhydrous HF source gas. It is well known that etching using liquid or aqueous HF produces significantly higher etch rates than etching using anhydrous HF gas. Nevertheless, the present invention provides high $SiO_2$ etch rates, e.g., about 0.5 to about 5 microns/minute, which tends to indicate that mechanisms other than normal anhydrous HF gas reaction are at work.

Of course, the above-mentioned etch rate may vary depending on the specific cleaning conditions and/or the composition of the accumulated $SiO_2$. Nevertheless, the ability to obtain etch rates typically associated with liquid aqueous HF reactants while using easy-to-handle anhydrous HF gas represents a significant advantage of the present invention. As a further advantage, when anhydrous HF gas is employed, a smaller amount may be required compared to amounts needed if aqueous HF solution were sloshed into the chamber for cleaning.

More significantly, the present invention permits cleaning to be done in-situ, i.e., by performing the cleaning steps directly on a deposition reactor operating at a production site and requiring no disassembly of the reactor chamber. The saving in time and money is clear when compared to more invasive prior art cleaning techniques, which may require the cumbersome and time-consuming task of dismantling the various components of the reactor chamber before cleaning, performing the cleaning on the disassembled parts, and then assembling the cleaned parts after cleaning.

Furthermore, the present invention permits cleaning of the chamber to be performed in a simple manner. According to the present invention, no complex power source may be required for efficient operation. In one embodiment, all that is required is a valve for introducing anhydrous HF gas into the reactor chamber. Most of the equipment, such as a vacuum pump, and a pressure control system to control the reaction and pump the reaction byproducts out of the chamber, are normally already part of the reactor chamber.

The simplicity aspect is particularly important for some reactor systems such as thermally activated CVD systems in which there exists no device for generating a plasma. For these reactors, the invention eliminates the needs for expensive and complicated devices such as a high-power radio frequency (RF) or microwave generators with associated control circuitry, power matching equipment and circuitry, insulators and stand-offs, cabling, transmission lines, Electro-Magnetic Interference (EMI) shielding devices, and others. Some or all of these devices would have been necessary if one were to perform cleaning using the prior art plasma NF3 cleaning process, which was discussed earlier herein. The present invention, in sharp contrast, eliminates such complexities.

As a further advantage, the invention permits the byproduct gases to be pumped away, which is substantially simpler and faster than removing liquid reactants from a chamber. Additionally, it is found that the disposal of the byproduct materials of the present invention, such as $SiF_4$ and $H_2O$, has, to date, presented minimal environmental consequences. Unconsumed HF gas, being soluble, is also easier to disposed of and has substantially no detectable emission when used with standard scrubber equipment. Accordingly, the costs associated with acquiring and disposing the HF reactant gas and byproduct gases of the invention have been found to be relatively low compared to the cost of acquiring and disposing, for example unconsumed $CF_4$, $C_2F_6$, $SF_6$, or $NF_3$ and/or their byproducts. Since no physical sputtering is required, the potentiality of sputtering damage to exposed chamber components is substantially reduced.

In a step 306, the cleaning step is ended and post cleaning steps are performed. Cleaning may end responsive to an "endpoint," i.e. when substantially all the deposition material is deemed to have been removed from the reactor chamber interior. A mass spectrometer may be employed to determine the endpoint. For example, the mass spectrometer may be employed monitor the concentration of one of the reaction byproducts, such as $SiF_4$, and may end the cleaning step when no changes in its concentration is detected during a given period of time.

An alternative method of detecting the endpoint might include detecting the chemoluminescent signal from the reaction. For example, a sensitive photodetector may be employed to detect the light emitted as the accumulated deposition material is consumed. When the chemoluminescent signal decays to a predefined low steady state value, an endpoint may be established to end the cleaning process. As mentioned earlier, no replenishing water is produced after the reaction of FIG. 1 ends. Accordingly, any remaining water evaporates over time (due to the low pressure and/or the temperature in the chamber) to be evacuated as vapors, elegantly removing any trace of the cleaning process. Step 306 may include, for example, turning off the anhydrous HF supply, and/or reconnecting the gas inlet of the reactor chamber to a gas source for further deposition, as well as preparing the chamber for further processing of substrates.

Figure 4:
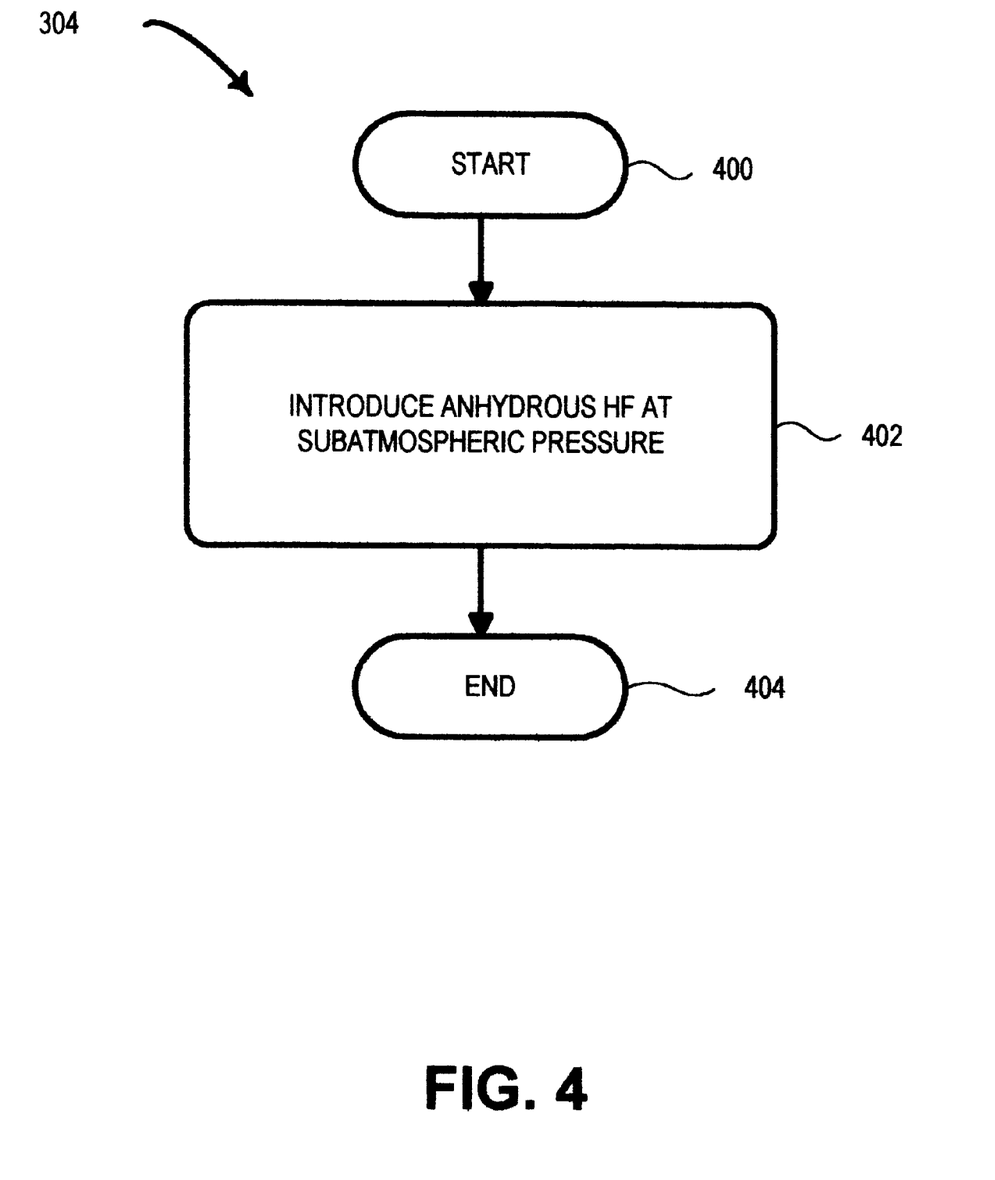
FIG. 4 shows a process flow diagram of an alternative embodiment of step 304 of FIG. 3.

In one embodiment, cleaning may be performed as the chamber interior is maintained at a sub-atmospheric pressure, e.g., below about 760 Torr at sea level in one example. FIG. 4 illustrates this embodiment of the invention wherein step 304 FIG. 4 is carried out at a sub-atmospheric pressure. It is believed that sub-atmospheric pressure cleaning condition helps reduce the condensation of anhydrous HF. This pressure range also ensures adequate water evaporation, thereby preventing an undue amount of water to be accumulated in the system as water is continually produced by aforementioned Eq. 1.

Figure 5:
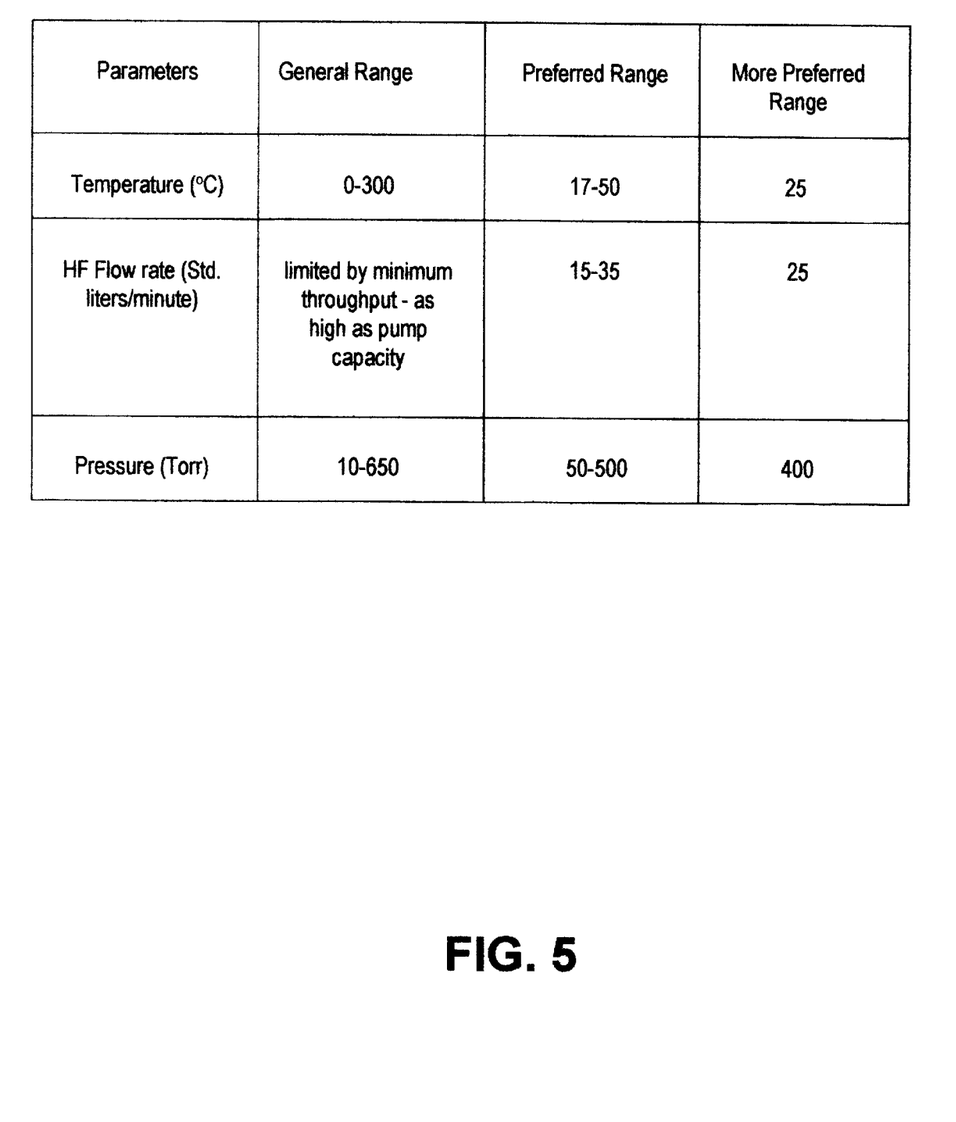
FIG. 5 is a table of approximate preferred values for various parameters that may be employed to conduct the in-situ anhydrous HF cleaning process according to one embodiment of the present invention.

To further facilitate discussion, FIG. 5 is a table that sets forth the approximate preferred values for various parameters employed to conduct the in-situ anhydrous HF cleaning process according to one embodiment of the present invention. In the example of FIG. 5, a 6-inch wafer is employed as a test wafer in the aforementioned DSM9800™ thermal CVD deposition reactor. The wafer has disposed thereon a layer of silicon dioxide overlying a layer of aluminum. This layer combination is selected to evidence the ability of the present invention to clean accumulated $SiO_2$ from the interior surfaces of chambers which employ aluminum. It is expected, however, that the invention may also be employed to clean chambers constructed from other materials, e.g., nickel-plated stainless steel as in the case of many thermal CVD chambers. The selection of the appropriate parameters for a particular chamber and/or a particular accumulated material is well within the skills of those familiar with the art given this disclosure.

The parameters of the etching process as shown in FIG. 5 includes temperature, anhydrous HF gas flow rate and pressure. In general, it is desirable to select the combination of temperature, anhydrous HF gas flow rate and pressure such that the HF and/or any products from the cleaning reaction does not condense into a fluid, which may lead to damage to the reactor components, including the reactor walls.

Temperature refers to the temperature inside the reactor chamber. In some cases, lower temperatures may promote rapid glass removal. When low temperatures are involved, however, it is preferable to select a pressure setting that limits or prevents condensation. In one embodiment, the temperature inside the reactor chamber may range from between about 0° C. to about 300° C., preferably range from between about 17° C. to about 50° C., and more preferably at about 25° C.

The use of low reactor chamber temperatures, e.g., between about 0° C. to about 300° C., is a non-obvious step of the present invention. This is because the temperature inside a reactor chamber, such as the DSM9800™ thermal CVD reactor, may reach as high as about 700° C. to about 900° C. during use, e.g., during normal $SiO_2$ deposition processes. Cooling the reactor chamber, which has a large thermal mass, from such high temperatures down to room temperature for cleaning requires a long cooling off period, which lowers the throughput. Thus, in order to shorten the cooling off period, it would seem intuitive to clean the reactor at a higher temperature in order to reduce the cooling time and to maximize system throughput. This higher temperature may correspond to, for example, the second maximum peak C in the graph of FIG. 2, which is about 500° C.–600° C.

Additionally, cleaning at this high temperature, e.g., about 500° C.–600° C., tends to maximize the longevity of any quartz components (e.g., gas transition rings, heater supports, heat shield spacers and/or others) in the deposition chamber. Generally, the quartz ring may be at about 300° C. when the reactor temperature is about 550° C. In accordance with FIG. 2, this quartz ring temperature of 300° C. corresponds to minimum $SiO_2$, i.e., quartz, etching, thereby minimizing wear of this quartz component during cleaning. Accordingly, this would make it intuitive to run the cleaning process at a high temperature, e.g., about 500° C.–600° C.

Nevertheless, the invention performs its in-situ anhydrous HF cleaning at the lower temperature of between about 0° C. to about 300° C. despite the requirement of a longer cooling time. Some of the time lost may be recouped, however, due to the higher etch rates achievable at lower temperatures (e.g., as shown between point A and B in FIG. 2). Of course if the reactor chamber employs plasma for deposition, its operating temperature may be lower than that associated with thermally activated CVD reactors. Correspondingly, little or no cooling time may be required. To prevent damage to quartz-containing components, it may be preferable to coat these quartz-containing components with, for example, sapphire. Alternatively, quartz-containing components may be removed altogether from the chamber for cleaning.

Flow rate refers to the flow rate of the reactant source gas, e.g., anhydrous HF gas, into the reactor chamber. If the flow rate is too low, there is insufficient reactant source gas and the $SiO_2$ etch may proceed at a rate that is too low for acceptable throughput. In contrast, if the flow rate is too high, the reactor pump may not be able to adequately evacuate the left-over source gas and byproduct gases, thereby leading to instability in pressure within the reactor chamber. Additionally, an undue amount of inputted anhydrous HF gas may lead to waste, since increasing amounts of anhydrous HF gas may be pumped through the reactor chamber without significantly increasing the SiO2 etch rate.

It may be, therefore, important to have a flow rate that balances the $SiO_2$ etch rate against the cost of anhydrous HF gas input and disposal. Thus, the flow rate may generally be as low as limited by throughput requirements and as high as limited by reasonable cost of anhydrous HF gas and/or pump capacity. In the present example, the flow rate may range from between about 15 standard liters/minute to about 35 standard liters/minute and more preferably be about 25 standard liters/minute. Of course the anhydrous HF flow rate, as are other parameters discussed in connection with FIG. 5, may vary depending on the design of the reactor, the required throughput, the composition of the deposited glass to be removed, and/or other parameters.

Pressure refers to the pressure inside the reactor chamber during the cleaning cycle. In the present example, the chamber interior pressure may generally range from between about 10 to about 650 Torr, preferably range from between about 50 to about 500 Torr and more preferably be about 400 Torr. In general, too low a pressure may result in etch inefficiency since there is little reactant material to react with the accumulated glass. Too high a pressure may cause the reaction of Eq. 1 to proceed at an undue rate, thereby producing excessive water, which may dilute the concentration of the aqueous HF solution and/or drench the chamber interior and stop the reaction altogether. An excessively high pressure may also undesirably cause anhydrous HF gas to condense.

In the example of FIG. 5, the $SiO_2$ layer etches at a rate of between about 0.5 microns/minute and about 5 microns/minute, which is considered satisfactory. Of course, this rate will vary depending on the composition of the accumulated deposition material inside the reactor chamber, the specific conditions of the cleaning reaction, and/or other parameters.

While this invention has been described in terms of several preferred embodiments, there are alterations, permutations, and equivalents which fall within the scope of this invention. It should also be noted that there are may alternative ways of implementing the methods and apparatuses of the present invention. It is therefore intended that the following appended claims be interpreted as including all such alterations, permutations, and equivalents as fall within the true spirit and scope of the present invention.

What is claimed is:

1. A method for removing deposition material from a chamber interior of a reactor chamber, at least one interior surface of said chamber interior having said deposition material deposited thereon, comprising:

introducing a gaseous cleaning mixture comprising an anhydrous hydrogen fluoride (HF) gas into said chamber interior;

maintaining said chamber interior at a temperature of between about 0° C. and about 50° C.; and transporting a gaseous reaction byproduct from said chamber interior by use of a pump, wherein said chamber pressure is about 400 Torr, and wherein said temperature, said pressure, and a flow rate of said anhydrous HF gas are configured to cause an aqueous solution of HF to exist in said reactor chamber during said transporting.

2. The method of claim 1, wherein said transporting said gaseous reaction product is accomplished by a pump, and a maximum flow rate of said anhydrous HF gas is limited by a capacity of said pump.

3. The method of claim 1, wherein said transporting said gaseous reaction product is accomplished by a pump, and a minimum flow rate of said anhydrous HF gas is limited by a throughput of said reactor chamber.

4. The method of claim 1, wherein a flow rate of said anhydrous HF gas into said chamber interior is between about 15 standard liters/minute and 35 standard liters/minute.

5. The method of claim 1, wherein said reactor chamber represents a plasma processing chamber inside which the plasma is produced by inductively coupling action.

6. A method for removing $SiO_2$ deposition from a deposition reactor chamber interior, said deposition reactor chamber interior being configured for depositing $SiO_2$ material on a substrate, comprising:

introducing a gaseous cleaning mixture comprising anhydrous hydrogen fluoride (HF) gas into said deposition reactor chamber interior;

maintaining said deposition reactor chamber interior at a temperature of between about 0° C. and about 50° C.;

maintaining said deposition reactor chamber interior at a pressure of below about 760 Torr; and transporting a reaction byproduct from said deposition reactor chamber interior, wherein said temperature, said pressure, and a flow rate of said anhydrous HF gas are configured to prevent one of said anhydrous HF gas and said reaction byproduct from condensing in said deposition reactor chamber interior.

7. The method of claim 6, wherein said deposition reactor chamber represents a chemical vapor deposition (CVD) reactor chamber.

8. The method of claim 6, wherein said deposition reactor chamber represents a plasma-enhanced chemical-vapor deposition (PECVD) reactor chamber.

9. The method of claim 6 wherein said temperature, said pressure, and a flow rate of said anhydrous HF gas are configured to cause an aqueous solution of HF to exist in said deposition reactor chamber interior during said removing.

* * * * *